US006731506B1

(12) United States Patent
Dong et al.

(10) Patent No.: US 6,731,506 B1
(45) Date of Patent: May 4, 2004

(54) RETAINING DEVICE FOR HEAT SINK

(75) Inventors: Shun Chi Dong, Austin, TX (US);
Chung Yuan Huang, Austin, TX (US);
Yeu-Lih Lin, Tu-chen (TW)

(73) Assignee: Hon Hai Precision Ind. Co., Ltd.,
Taipei Hsien (TW)

(*) Notice: Subject to any disclaimer, the term of this patent is extended or adjusted under 35 U.S.C. 154(b) by 0 days.

(21) Appl. No.: 10/366,987

(22) Filed: Feb. 15, 2003

(51) Int. Cl.[7] .................................................. H05K 7/20
(52) U.S. Cl. ........................... 361/719; 24/296; 24/458; 257/719; 361/703
(58) Field of Search .......................... 24/296, 453, 457, 24/458, 624; 248/505, 510; 165/80.3, 185, 121–126; 257/718, 719, 722, 726, 727; 439/485, 487; 174/16.3; 361/687, 703–705, 709–712, 717–719

(56) References Cited

U.S. PATENT DOCUMENTS 5,448,449 A * 9/1995 Bright et al. ............... 361/704
5,771,155 A * 6/1998 Cook ......................... 361/710

* cited by examiner

Primary Examiner—G. Tolin
(74) Attorney, Agent, or Firm—Wei Te Chung

(57) ABSTRACT

A retaining device includes a retention frame (20), a back plate (40), a clip (10) and a wire arm (30). The retention frame forms a pair of protrusions (24, 25) at respective opposite sides thereof and an ear (26) at one of said sides of the retention frame. A pair of posts (44) extends from the back plate and further protrudes from the protrusions. The clip comprises a pressing lever (12) and a pair of legs (14, 16) depending from the lever. A pair of hooks (142, 162) is inwardly formed from the legs for engaging with the posts. The wire arm comprises a locating portion (34) positioned on the retention frame, a pressing portion (32) resting on the clip and an operating portion (36) clamped under the ear of the retention frame. The locating portion and the operating portion extend in opposite directions from the pressing portion.

17 Claims, 4 Drawing Sheets

RETAINING DEVICE FOR HEAT SINK

BACKGROUND OF THE INVENTION

1. Field of the Invention

The present invention relates to a retaining device, and more particularly to a retaining device for securing a heat sink to an electronic package.

2. Description of Prior Art

Electronic packages generate heat during normal operation. The heat must be removed from the electronic packages for keeping them stable. Conventionally, a retaining device secures a heat sink on an electronic package. A common retaing device comprises a retention frame and a clip. The retention frame is mounted on a printed circuit board (PCB) and surrounds the electronic package therearound. The retention frame forms a pair of ears at opposite sides thereof. The clip comprises a pressing portion pressing on the heat sink and a pair of clamping legs depending from the pressing portion. The legs each defines an opening therein for engaging with the ears of the retention frame. Thus, the heat sink is attached on the electronic package to remove heat.

However, modem high-speed electronic packages are able to process signals at unprecedented high speeds. As a result, the electronic packages can generate huge amounts of heat during operation. To keep normal operation of an electronic package and prevent the electronic package from being destroyed, the heat sink must be developed to have great heat dissipation capability. The heat sink is correspondingly heavy. Correspondingly, the retaining device is developed to be strong enough. This makes the engagement of the clip and the retention frame laborsome. Thus, tools are required to facilitate the clip to be engaged with the retention frame.

SUMMARY OF THE INVENTION

Accordingly, an object of the present invention is to provide a retaining device which easily fastens a heat sink to an electronic package without any tool.

In order to achieve the object set out above, a retaining device in accordance with a preferred embodiment of the present invention comprises a retention frame, a back plate, a clip and a wire arm. The retention frame forms a pair of protrusions at opposite sides thereof and an ear at one of said sides of the retention frame. A pair of posts extends from the back plate and further protrudes from the protrusions. The clip comprises a pressing lever and a pair of legs depending from the lever. A pair of hooks is inwardly formed from the legs for engaging with the posts. The wire arm comprises a locating portion positioned on the retention frame, a pressing portion resting on the clip and an operating portion clamped under the ear of the retention frame. The locating portion and the operating portion extend in opposite directions from the pressing portion.

Other objects, advantages and novel features of the present invention will become more apparent from the following detailed description when taken in conjunction with the accompanying drawings, in which:

DETAILED DESCRIPTION OF THE INVENTION

Figure 1:
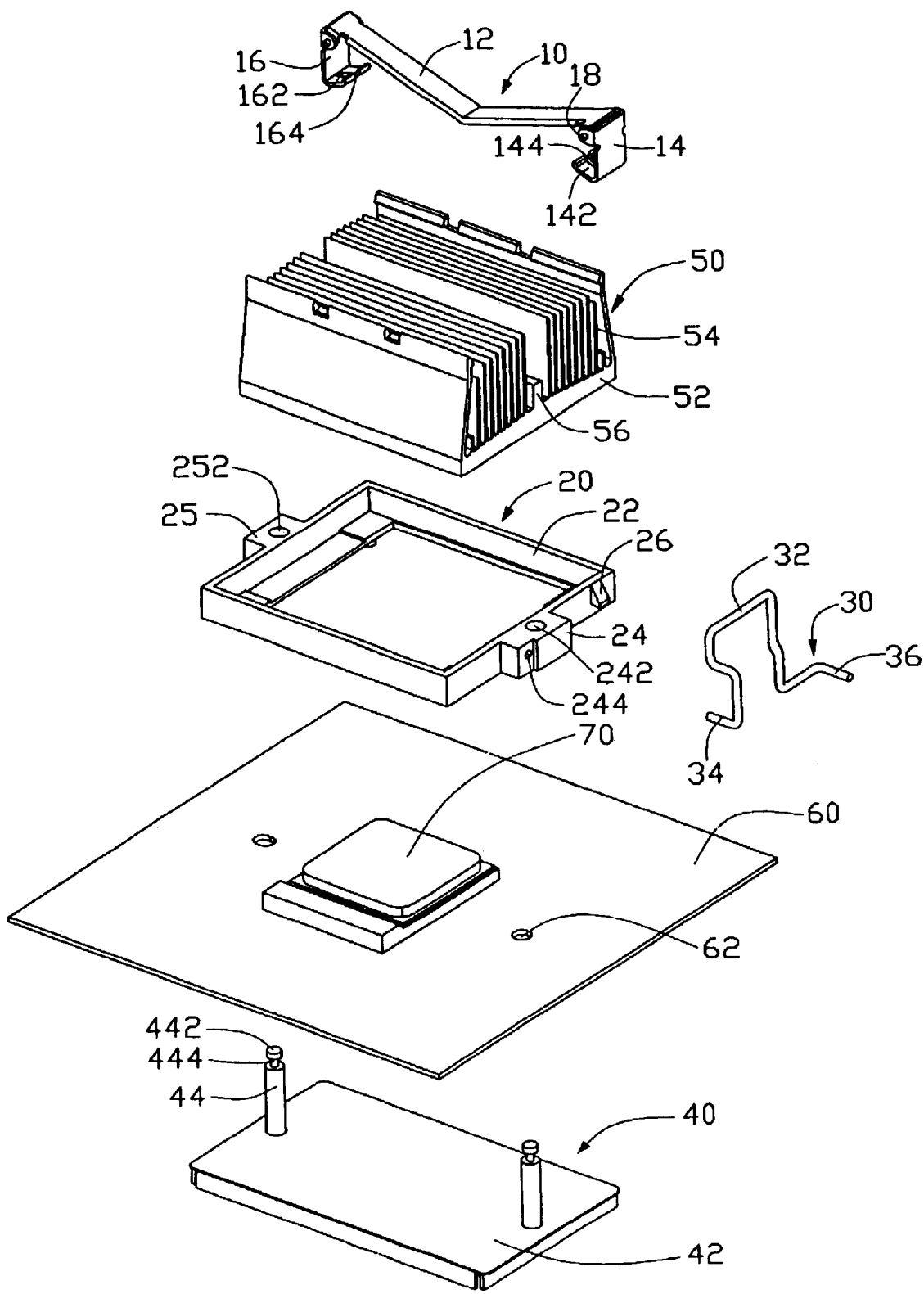
FIG. 1 is an exploded isometric view of a retaining device in accordance with a preferred embodiment of the present invention, together with a heat sink, an electronic package mounted on a PCB.

FIG. 1 shows a retaining device in accordance with a preferred embodiment of the present invention, a heat sink 50, a printed circuit board (PCB) 60, and an electronic package such as a central processing unit (CPU) 70 mounted on the PCB 20. The retaining device comprises a clip 10, a retention frame 20, a wire arm 30, and a back plate 40. The PCB 20 defines a pair of holes 62 therein at respective opposite sides of the CPU 70.

The heat sink 50 comprises a base 52, a plurality of fins 54 extending upwardly from the base 52, and a ridge 56 projecting upwardly from a central portion of the base 52 between two centermost of the fins 54.

The clip 10 comprises a resilient pressing lever 12, a pair of legs 14, 16, and a pair of pivot pins 18. The legs 14, 16 are pivotally connected to respective opposite ends of the pressing lever 12 by the pins 18, and are rotatable about the corresponding pins 18. A pair of hooks 142, 162 is integrally formed at respective distal ends of the legs 14, 16, the hooks 142, 162 extending inwardly and slightly upwardly from the legs 14, 16. A pair of cutouts 144, 164 is respectively defined in the hooks 142, 162.

The retention frame 20 comprises four integrally formed sidewalls 22. A pair of first and second protrusions 24, 25 is outwardly from a pair of opposite of the sidewalls 22 respectively. An aperture 242 is vertically defined in a central portion of the first protrusion 24. An aperture 252 is vertically defined in a central portion of the second protrusion 25. A bore 244 is horizontally defined in the first protrusion 24 at one side of the aperture 242. An ear 26 is outwardly formed from the sidewall 22 that has the first protrusion 24. The ear 26 is disposed at an opposite side of the aperture 242.

The wire arm 30 comprises a central pressing portion 32, a locating portion 34, and an operating portion 36. The wire arm 30 is formed by bending a metal rod. The locating portion 34 and the operating portion 36 extend away from respective opposite ends of the pressing portion 32.

The back plate 40 comprises a rectangular main body 42, and a pair of posts 44 extending upwardly from respective opposite ends of the body 42. Each post has a head 442 at a distal end thereof. A narrowed neck 444 is formed at each post 44 adjoining a bottom of the corresponding head 442.

Figure 2:
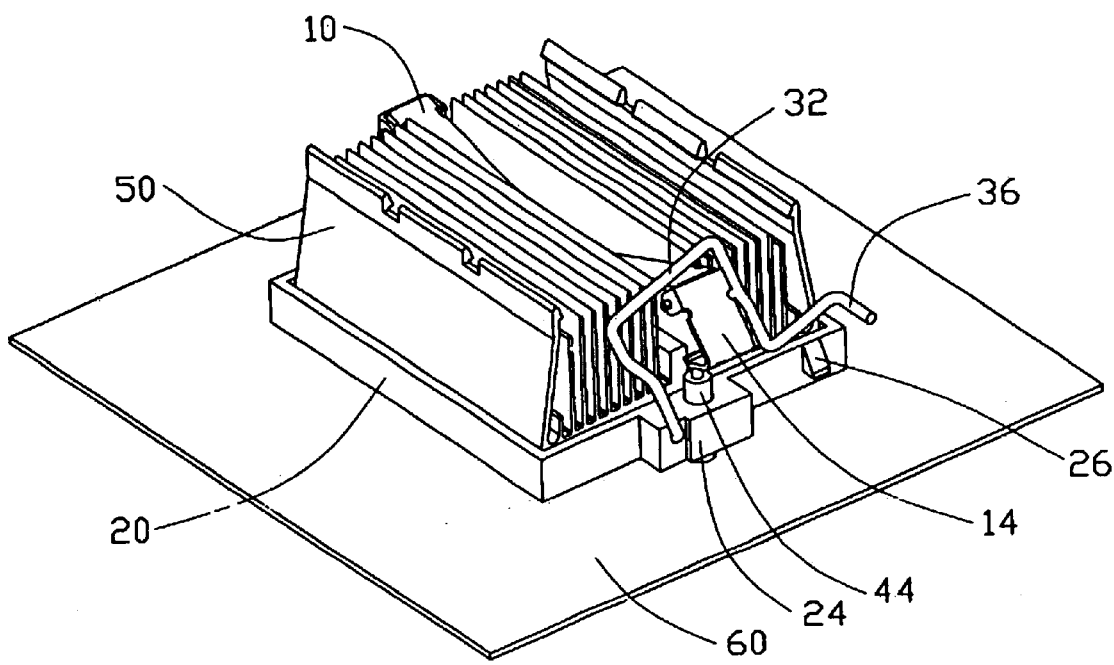
FIG. 2 is an assembled view of FIG. 1, showing the heat sink loosely attached on the electronic package by the retaining device.
Figure 3:
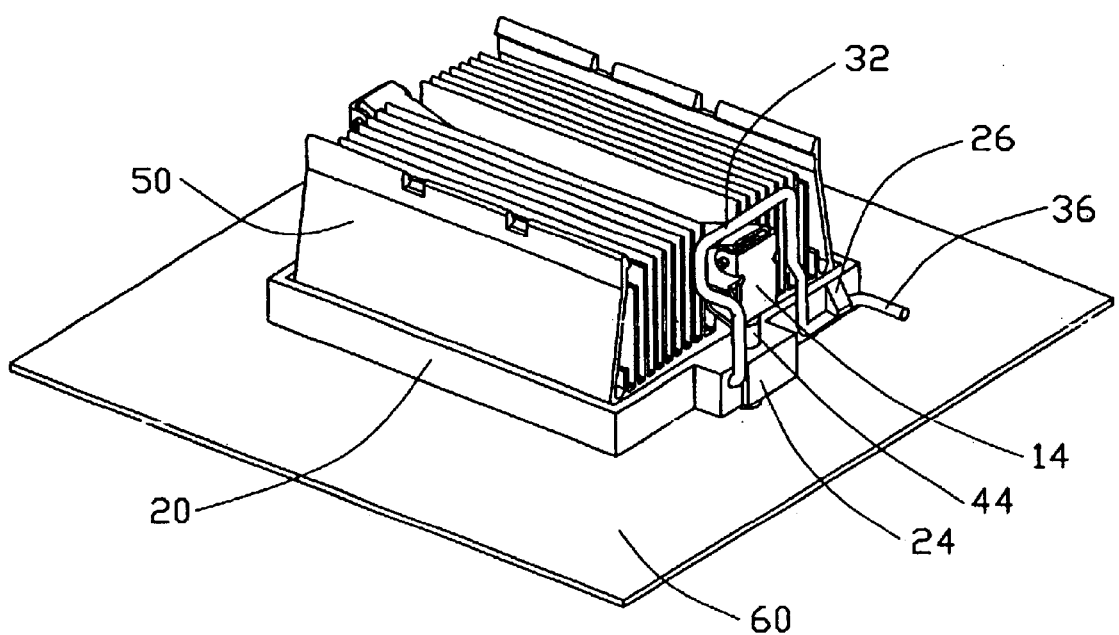
FIG. 3 is similar to FIG. 2, but showing the heat sink firmly attached on the electronic package by the retaining device.
Figure 4:
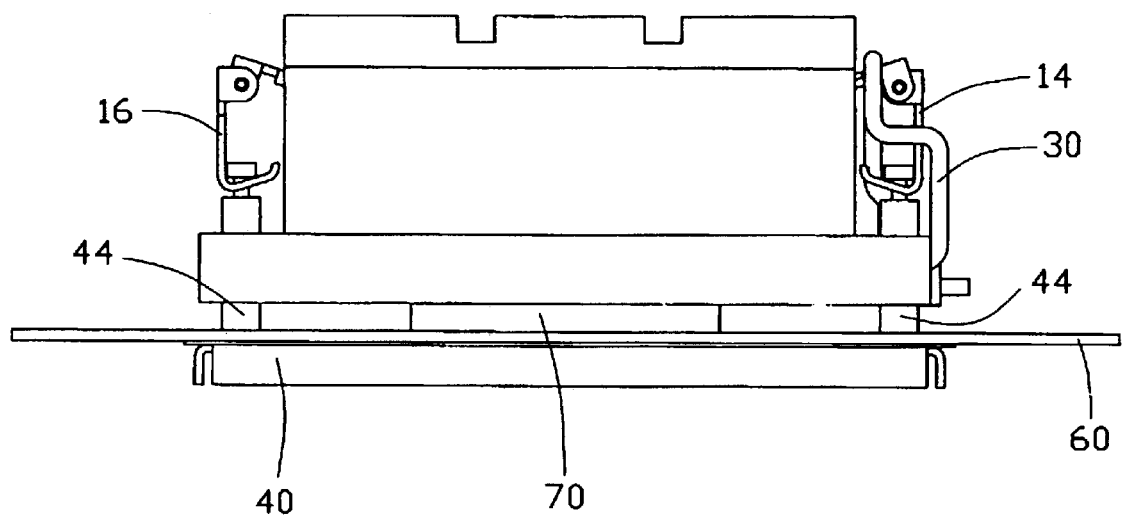
FIG. 4 is a left side elevation view of FIG. 3.

Referring also to FIGS. 2–4, in assembly, the posts 44 of the back plate 40 are interferentially extended through the holes 62 of the PCB 60 and the respective apertures 242, 252 of the retention frame 20. Thus, the retention frame 20 is supported on the PCB 60 and surrounds the CPU 70. The heads 442 and the necks 444 of the posts 44 protrude up from the protrusions 24, 25. The heat sink 50 is placed on the CPU 70, with the base 52 surrounded by the retention frame 20. The clip 10 is placed on the heat sink 50, with the pressing lever 12 resting on the ridge 56. The hook 162 of the clip 10 is loosely engaged with the post 44 protruding from the second protrusion 25, with the neck 444 of said post 44 being received in the cutout 164 of the hook 162.

The wire arm 30 is attached to the first protrusion 24 of the retention frame 20, with the locating portion 34 being received in the bore 244. The pressing portion 32 of the wire arm 30 is rested on an end of the pressing lever 12 of the clip 10. The operating portion 36 is depressed toward the ear 26 of the retention frame 20. The pressing portion 32 thus presses the end of the pressing lever 12 of the clip 10 downwardly. Accordingly, the leg 14 is pressed toward the heat sink 50, and the cutout 144 of the leg 14 receives the neck 444 of the post 44 protruding from the first protrusion 24. Thus the hook 142 of the clip 10 is loosely engaged with said post 44, and the hook 162 of the clip 10 is firmly engaged with the other post 44. The operating portion 36 is depressed further and clamped under the ear 26. Thus the cutout 144 of the hook 142 is firmly engaged with the post 44 protruding from the first protrusion 24. Accordingly, the clip 10 is resiliently engaged with both posts 44, and firmly attaches the heat sink 50 to the CPU 70.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A retaining device for securing a heat sink to an electronic package comprising:

a retention frame forming a pair of protrusions at opposite sides thereof;

a back plate having a pair of posts protruding through the protrusions;

a clip comprising a pressing lever and a pair of legs depending from the lever, a pair of hooks being inwardly formed respectively from the legs for engaging with the posts; and a wire arm engaging with the retention frame and resting on the clip.

2. The retaining device of claim 1, wherein the wire arm is formed by bending a metal rod.

3. The retaining device of claim 2, wherein the wire arm comprises a pressing portion, a locating portion and an operating portion, the locating portion and the operating portion extend in opposite directions from the pressing portion.

4. The retaining device of claim 3, wherein a bore is defined in the retention frame for receiving the locating portion of the wire arm.

5. The retaining device of claim 4, wherein the bore is extended along a direction perpendicular to the posts.

6. The retaining device of claim 4, wherein an ear is outwardly formed on the retention frame for clamping the operating portion of the wire arm therebelow.

7. The retaining device of claim 1, wherein each post has a head at an end thereof away from the back plate and a neck adjoining the head.

8. The retaining device of claim 7, wherein the protrusions vertically each define an aperture therein for interferential insertion of the corresponding one post of the back plate.

9. The retaining device of claim 7, wherein the hooks of the clip each define a cutout therein for engaging with the neck of the corresponding post.

10. The retaining device of claim 1, wherein the legs are pivotally connected to respective opposite ends of the pressing lever.

11. A heat sink assembly comprising:

a printed circuit board;

an electronic package mounted on the printed circuit board;

a heat sink placed on the electronic package; and a retaining device for attaching the heat sink to the electronic package, the retaining device comprising a retention frame mounted on the printed circuit board and surrounding the electronic package, a clip placed on the heat sink, and a wire arm positioned on the retention frame and resting on the clip at an end of the clip, a pair of posts protruding from the retention frame and engaged with the clip.

12. The heat sink assembly of claim 11, wherein the wire arm is traversed on said end of the clip, and comprises a locating portion positioned to the retention frame and an operating portion for facilitating the engagement of the clip and the posts.

13. The heat sink assembly of claim 12, wherein the retention frame forms an ear thereon correspondingly clamping the operating portion therebelow.

14. The heat sink assembly of claim 11, wherein the retention frame forms a pair of protrusions at opposite sides thereof.

15. The heat sink assembly of claim 14, wherein the printed circuit board defines a pair of holes therein, and wherein the protrusions each defines an aperture therein aligned with the holes of the printed circuit board.

16. The heat sink assembly of claim 15, wherein the posts are interferentially inserted into the holes and the apertures and further protruded from the protrusions.

17. A heat sink assembly comprising:

a printed circuit board defining at least one through hole therein;

an electronic package assembly mounted on the printed circuit board;

a heat sink seated upon the electronic package assembly;

a retention frame surrounding the electronic package assembly defining a through aperture in alignment with said through hole;

a back plate positioned on an undersurface of the printed circuit board with at least one post extending upwardly through said through hole and said through aperture; and a clip positioned on the heat sink and pressing downwardly against the heat sink, said clip defining a pivotal leg including at a bottom portion a hook with a cutout therein, said cutout extending through a distal edge of said hook to communicate with an exterior so as to allow said hook to pivotally approach said post and have a top end of the post enter said cutout from said distal edge and further retainably received in said cutout, thus securing said heat sink relative to said electronic package assembly.

* * * * *